US009606689B2

(12) United States Patent
Yoshiki

(10) Patent No.: US 9,606,689 B2
(45) Date of Patent: Mar. 28, 2017

(54) OPTICALLY TRANSPARENT ELECTRODE

(71) Applicant: Mitsubishi Paper Mills Limited, Sumida-ku, Tokyo (JP)

(72) Inventor: Takenobu Yoshiki, Sumida-ku (JP)

(73) Assignee: MITSUBISHI PAPER MILLS LIMITED, Tokyo (JP)

( * ) Notice: Subject to any disclaimer, the term of this patent is extended or adjusted under 35 U.S.C. 154(b) by 30 days.

(21) Appl. No.: 14/767,154

(22) PCT Filed: Feb. 3, 2014

(86) PCT No.: PCT/JP2014/052424
§ 371 (c)(1),
(2) Date: Aug. 11, 2015

(87) PCT Pub. No.: WO2014/129298
PCT Pub. Date: Aug. 28, 2014

(65) Prior Publication Data
US 2015/0378477 A1 Dec. 31, 2015

(30) Foreign Application Priority Data

Feb. 22, 2013 (JP) .................................. 2013-032914
Dec. 26, 2013 (JP) .................................. 2013-269052

(51) Int. Cl.
*G06F 3/044* (2006.01)
*G06F 1/16* (2006.01)
(Continued)

(52) U.S. Cl.
CPC ............... *G06F 3/044* (2013.01); *G06F 1/16* (2013.01); *H05K 1/0298* (2013.01);
(Continued)

(58) Field of Classification Search
CPC ........... G06F 3/044; G06F 2203/04112; H05K 1/0296; H05K 1/0298
See application file for complete search history.

(56) References Cited

U.S. PATENT DOCUMENTS

2009/0277672 A1 11/2009 Matsumoto
2011/0291966 A1 12/2011 Takao et al.
(Continued)

FOREIGN PATENT DOCUMENTS

JP   H10-41682    2/1998
JP   2003-077350  3/2003
(Continued)

*Primary Examiner* — Dennis Joseph
(74) *Attorney, Agent, or Firm* — Fitzpatrick, Cella, Harper & Scinto

(57) ABSTRACT

A technical object of the present invention is to provide an optically transparent electrode which has a high total light transmittance, hardly produces moire, and has an excellent stability of electrical resistance values, and to achieve the object, provided is an optically transparent electrode having, on an optically transparent base material, optically transparent conductive layers having a sensor part electrically connected to a terminal part and a dummy part not electrically connected to the terminal part, the sensor part and the dummy part each having a repetition unit metal pattern of a predetermined shape, the sensor part of one of the optically transparent conductive layers being formed of a plurality of column electrodes extending in a first direction, the column electrodes and the dummy parts being arranged in an alternating manner, the sensor part of the other optically transparent conductive layer being formed of a plurality of column electrodes which extend in a second direction perpendicular to the first direction and are arranged alternately with the dummy parts.

20 Claims, 5 Drawing Sheets

(51) Int. Cl.
*H05K 1/02* (2006.01)
*H05K 3/10* (2006.01)

(52) U.S. Cl.
CPC .. *G06F 2203/04112* (2013.01); *H05K 1/0274* (2013.01); *H05K 3/106* (2013.01); *H05K 2201/0108* (2013.01)

(56) References Cited

U.S. PATENT DOCUMENTS

| | | | |
|---|---|---|---|
| 2012/0133622 A1 | 5/2012 | Brokken et al. | |
| 2012/0268418 A1 | 10/2012 | Ishizaki et al. | |
| 2013/0294037 A1 | 11/2013 | Kuriki et al. | |
| 2014/0063374 A1* | 3/2014 | Kuriki | G06F 3/044 349/12 |

FOREIGN PATENT DOCUMENTS

| | | |
|---|---|---|
| JP | 2005-250169 | 9/2005 |
| JP | 2007-188655 | 7/2007 |
| JP | 2007-287953 | 11/2007 |
| JP | 2007-287994 | 11/2007 |
| JP | 2011-248722 | 12/2011 |
| JP | 2012-033147 | 2/2012 |
| JP | 2012-226687 | 11/2012 |
| JP | 2012-243119 | 12/2012 |
| JP | 2013-501992 | 1/2013 |
| WO | 2012/099150 | 7/2012 |

* cited by examiner (a)

(b)

OPTICALLY TRANSPARENT ELECTRODE

This application is a national phase of PCT Application No. PCT/JP2014/052424 filed Feb. 3, 2014, which in turn is claims benefit of Japanese Application No. 2013-032914 filed Feb. 22, 2013 and Japanese Application No. 2013-269052 filed Dec. 26, 2013.

TECHNICAL FIELD

The present invention relates to an optically transparent electrode mainly used for touchscreens and, in particular, to an optically transparent electrode preferable for projected capacitive touchscreens.

BACKGROUND ART

In electronic devices, such as PDAs (personal digital assistants), laptop computers, office automation equipment, medical equipment, and car navigation systems, touchscreens are widely used as their display screens that also serve as input means.

There are a variety of touchscreens that utilize different position detection technologies, such as optical, ultrasonic, surface capacitive, projected capacitive, and resistive technologies. A resistive touchscreen has a configuration in which an optically transparent conductive material and a glass plate with a transparent conductive layer are separated by spacers and face each other. A current is applied to the optically transparent conductive material and the voltage of the glass plate with a transparent conductive layer is measured. In contrast, a capacitive touchscreen has, as its basic component, an optically transparent electrode in which an optically transparent conductive layer is provided on a base material, and does not have any movable parts. Due to high durability and high transmission, capacitive touchscreens are used in various applications. Further, projected capacitive technology allows simultaneous multipoint detection, and therefore is widely used for smartphones, tablet PCs, etc.

As optically transparent electrodes used for touchscreens, those having an optically transparent conductive layer made of ITO (indium tin oxide) formed on a base material have been commonly used. However, there has been a problem of low total light transmittance due to high refractive index and high surface light reflectivity of an optically transparent conductive layer made of ITO. Another problem is that an ITO conductive layer has low flexibility and thus is prone to crack when bent, resulting in an increased electrical resistance.

Known as an alternative to an optically transparent electrode having an optically transparent conductive layer made of ITO is an optically transparent electrode having a higher total light transmittance and a higher conductivity, the optically transparent electrode being obtainable by forming a mesh pattern of metal thin lines as an optically transparent conductive layer on an optically transparent base material, in which metal pattern, for example, the line width, pitch, pattern shape, etc. are appropriately adjusted. Regarding the pattern of the metal thin lines, it is known that a repetition unit of any shape may be used. For example, in Patent Literature 1, a triangle, such as an equilateral triangle, an isosceles triangle, and a right triangle; a quadrangle, such as a square, a rectangle, a lozenge, a parallelogram, and a trapezoid; a polygon, such as a hexagon, an octagon, a dodecagon, and an icosagon; a circle; an ellipse; and a star, and a combinational pattern of two or more thereof are used.

For the production of an optically transparent electrode using an optically transparent conductive layer consisting of metal thin lines, a semi-additive method comprising making a thin catalyst layer on a base material, making a resist pattern on the catalyst layer, making a laminated metal layer in an opening of the resist by plating, and finally removing the resist layer and the base metal protected by the resist layer for forming a conductive pattern is disclosed in, for example, Patent Literature 2, Patent Literature 3, etc.

Also, in recent years, a method in which a silver halide diffusion transfer process is employed using a silver halide photosensitive material as a precursor to a conductive material is known. For example, Patent Literature 4, Patent Literature 5, Patent Literature 6, etc. disclose a technology for forming a metal silver pattern by a pattern exposure and a reaction of a silver halide photosensitive material (a conductive material precursor) having a physical development nucleus layer and a silver halide emulsion layer in this order on a base material with a soluble silver halide forming agent and a reducing agent in an alkaline fluid. The patterning by this method can reproduce uniform line width. In addition, due to the highest conductivity of silver among all metals, a thinner line with a higher conductivity can be achieved as compared with other methods. An additional advantage is that an optically transparent conductive layer having a metal silver pattern obtained by this method has a higher flexibility, i.e., a longer flexing life as compared with an optically transparent conductive layer made of ITO.

Generally, in a projected capacitive touchscreen, an optically transparent electrode having two optically transparent conductive layers each having a sensor part formed of a plurality of column electrodes is used as a touch sensor. In such an application, a touchscreen in which a metal pattern having a repetition unit of any shape is used as a column electrodes has a problem. That is, an operator of the touchscreen usually keeps staring at the display, and as a result tends to recognize the metal pattern itself (the metal pattern is highly visible). Also, in the optically transparent electrode having two optically transparent conductive layers overlapped with each other, depending on the shape of the metal pattern, moire can be caused, resulting in even higher visibility. Further, in the cases of an optically transparent electrode in which the metal pattern having a repetition unit is formed of very thin metal lines, the electrical resistance value can vary depending on the pattern shape under an atmosphere of high humidity and high temperature. There has been no known method to solve the above mentioned problem of moire and the problem on the stability of electrical resistance values at the same time.

To address these problems, Patent Literature 7 proposes a method in which column electrodes with a metal pattern of which the repetition unit is in the shape of a lozenge are used for one of two optically transparent conductive layers while column electrodes with a metal pattern of which the repetition unit is the same lozenge rotated 90° are used for the other optically transparent conductive layer. However, in this method, moire maybe seen depending on conditions, and the problem of unstable electrical resistance values under an atmosphere of high humidity and high temperature is not sufficiently solved.

For example, Patent Literature 8 etc. propose a method in which a diamond-like pattern is used as the metal pattern of column electrodes, and the upper and lower optically transparent conductive materials are superposed in such a manner that the metal patterns constituting the column electrodes of the two optically transparent conductive layers never overlap with each other for solving the problem of moire.

However, in this method, the two optically transparent conductive layers need to be joined with very high positional accuracy, and insufficient accuracy tends to generate portions where the upper and lower patterns mistakenly overlap with each other or where no pattern exists, leading to even higher visibility. In addition, this method inevitably generates portions with narrower width of column electrodes, and such portions are more significantly affected by the problem of unstable electrical resistance values of the above-mentioned metal pattern having a repetition unit formed of very thin metal lines under an atmosphere of high humidity and high temperature.

CITATION LIST

Patent Literature

Patent Literature 1: JP 10-41682 A
Patent Literature 2: JP 2007-287994 A
Patent Literature 3: JP 2007-287953 A
Patent Literature 4: JP-2003-77350 A
Patent Literature 5: JP-2005-250169 A
Patent Literature 6: JP 2007-188655 A
Patent Literature 7: JP 2011-248722 A
Patent Literature 8: JP 2012-33147 A

SUMMARY OF INVENTION

Technical Problem

An object of the present invention is to provide an optically transparent electrode which has a high total light transmittance, hardly produces moire, and has an excellent stability of electrical resistance values and therefore is suitable as an optically transparent electrode for capacitive touchscreens.

Solution To Problem

The above object of the present invention is basically achieved by an optically transparent electrode having, on an optically transparent base material, at least two optically transparent conductive layers having a sensor part electrically connected to a terminal part and a dummy part not electrically connected to the terminal part, the sensor part and the dummy part each having a repetition unit metal pattern of a predetermined shape, the sensor part of one of the optically transparent conductive layers being formed of a plurality of column electrodes extending in a first direction, the column electrodes and the dummy parts being arranged in an alternating manner, the sensor part of the other optically transparent conductive layer being formed of a plurality of column electrodes which extend in a second direction perpendicular to the first direction and are arranged alternately with the dummy parts, the optically transparent electrode satisfying all of the following requirements (a) to (c).

$$k1 > j1 \qquad (a)$$

Here, k1 denotes the average length in the first direction of the predetermined unit metal pattern of the column electrodes extending in the first direction of one of the optically transparent conductive layers, and j1 denotes the average length in the second direction of the same predetermined unit metal pattern.

$$2M = n \times j1 \qquad (b)$$

Here, M denotes the average center-to-center distance of the column electrodes extending in the first direction, and n denotes a natural number.

$$k2 < j2; \qquad (c)$$

and neither k1/j2 nor j2/k1 is a natural number.

Here, k2 denotes the average length in the first direction of the predetermined unit metal pattern of the column electrodes extending in the second direction of the other optically transparent conductive layer, and j2 denotes the average length in the second direction of the same predetermined unit metal pattern.

Preferably, the following requirement (d) is satisfied.

$$2L = p \times k2 \qquad (d)$$

Here, L denotes the average center-to-center distance of column electrodes of the other optically transparent conductive layer, the column electrodes extending in the second direction, and p denotes a natural number.

Preferably, the following requirement (e) is satisfied.

$$2L = q \times k1 \qquad (d)$$

Here, q denotes a natural number.

Preferably, a requirement of 0.1×k1<j1<0.7×k1 is satisfied, and more preferably, a requirement of 0.35×k1<j1<0.6×k1 is satisfied. Preferably, a requirement of 0.15×j2<k2<0.7×j2 is satisfied, and more preferably, a requirement of 0.35×j2<k2<0.6×j2 is satisfied.

In an optically transparent conductive layer, the predetermined unit metal pattern shape of the sensor part and the predetermined unit metal pattern shape of the dummy part are preferably congruent. Preferably, the predetermined unit metal pattern shape is a lozenge, and the diagonals thereof are in the first direction and in the second direction (perpendicular to the first direction).

Advantageous Effects of Invention

The present invention can provide an optically transparent electrode which has a high total light transmittance, hardly produces moire, and has an excellent stability of electrical resistance values and therefore is suitable as an optically transparent electrode for capacitive touchscreens.

DESCRIPTION OF EMBODIMENTS

Hereinafter, the present invention will be illustrated in detail with reference to drawings, but it is needless to say that the present invention is not limited thereto and various alterations and modifications may be made without departing from the technical scope of the invention.

Figure 1:
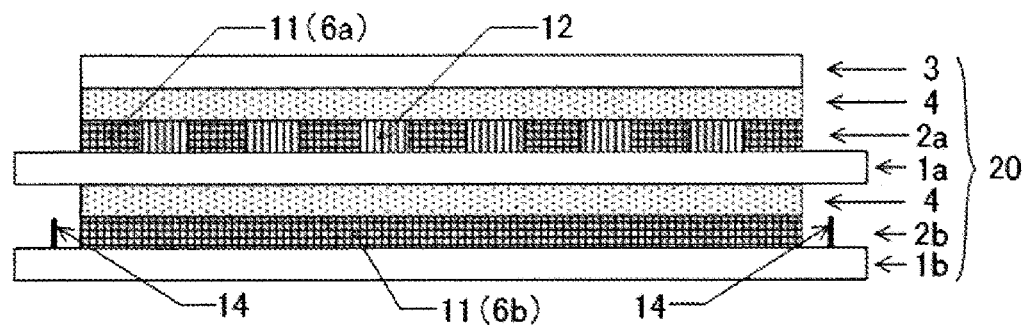
FIG. 1 is a schematic view showing a cross-section of an example of the optically transparent electrode of the present invention, taken along the A-A' line in FIGS. 4(a) and (b).
Figure 4:
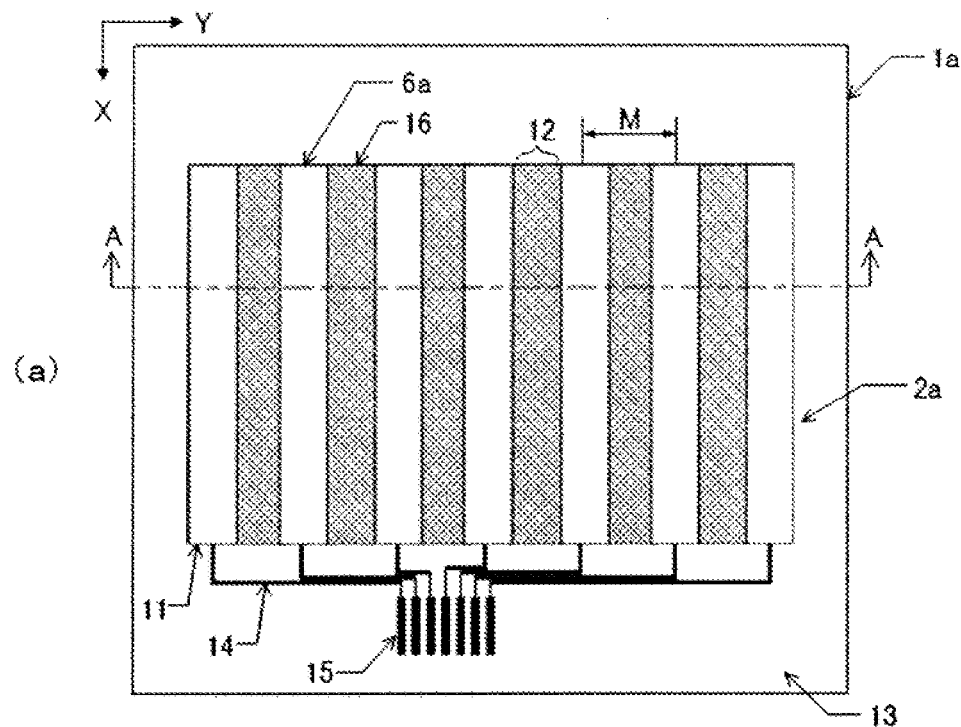
FIG. 4 is schematic plan view showing a part of the configuration of the optically transparent electrode of the present invention, where an optically transparent conductive material 1a having an optically transparent conductive layer 2a and an optically transparent conductive material 1b having an optically transparent conductive layer 2b taken out of FIG. 1 are separately shown for the purpose of clarity (in reality, an optically transparent conductive material 1a having an optically transparent conductive layer 2a lies directly on an optically transparent conductive material 1b having an optically transparent conductive layer 2b).
Figure 4:
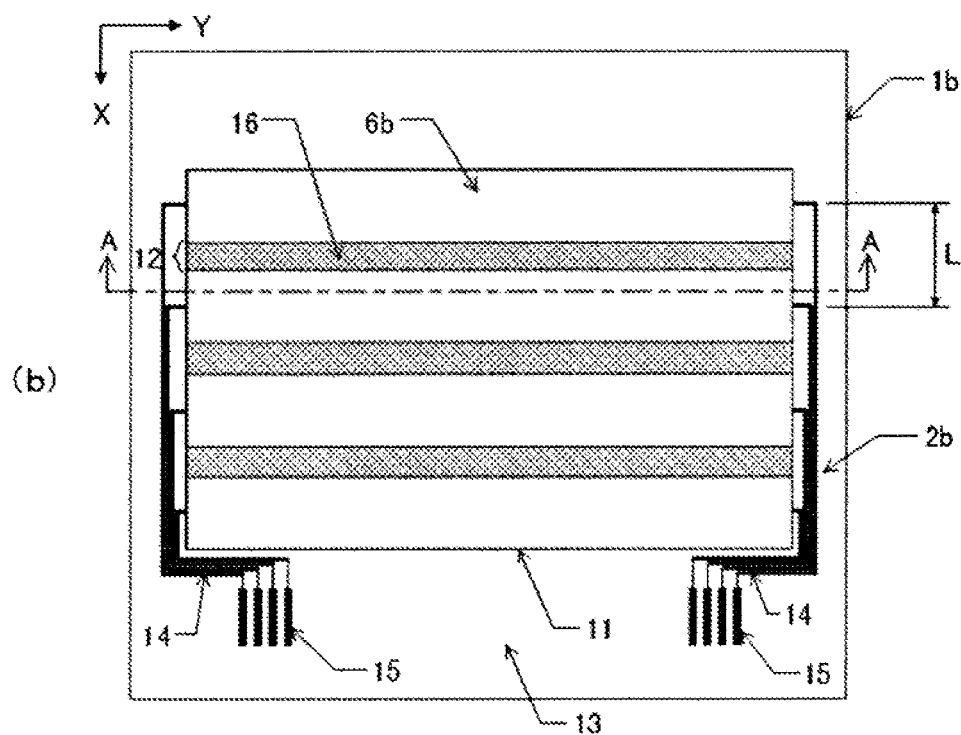

FIG. 1 is a schematic view showing a cross-section of an example of the optically transparent electrode of the present invention. In FIG. 1, an optically transparent electrode 20 has, on one side of an optically transparent base material 1a, an optically transparent conductive layer 2a having a sensor part 11 formed of a plurality of column electrodes 6a and a plurality of dummy parts 12, the column electrodes 6a and the dummy parts 12 being arranged in an alternating manner. As shown in FIG. 4 (a), each column electrode 6a is connected to a wiring part 14, and the wiring part 14 is connected to a terminal part 15. On the side of the optically transparent base material 1a opposite to the side having the optically transparent conductive layer 2a, an optically transparent conductive layer 2b is provided on an optically transparent base material 1b, and the optically transparent conductive layer 2b and the optically transparent base material 1a are joined together via an adhesive layer 4. The optically transparent conductive layer 2b has a sensor part 11 formed of a plurality of column electrodes 6b and a plurality of dummy parts 12, the column electrodes 6b and the dummy parts 12 being arranged in an alternating manner. Since the column electrodes 6b are lined in the direction perpendicular to the column electrodes 6a, only one is shown in FIG. 1 and dummy parts 12 are not shown. As shown in FIG. 4 (b), in the optically transparent conductive layer 2b as well, each column electrode 6b is connected to a wiring part 14 in the same manner as the column electrode 6a is, and the wiring part 14 is connected to a terminal part 15. The dummy parts may be arranged also in the positions surrounding the column electrodes of the optically transparent electrode.

As described above, the optically transparent electrode of the present invention has two optically transparent conductive layers (2a and 2b in FIG. 1). An exemplary method for providing a plurality of optically transparent conductive layers on an optically transparent base material is as follows. An optically transparent conductive layer is provided on one side of an optically transparent base material using, for example, the above-mentioned publicly known method (the semi-additive method or a method with use of a silver halide photosensitive material); a metal mesh not having any base material is produced by the method described in, for example, JP-2006-111889 A; and then the obtained metal mesh is placed onto the other side of the optically transparent base material and joined therewith. However, joining metal meshes not having any base material is extremely troublesome. For this reason, it is preferred to produce two optically transparent conductive materials each having an optically transparent conductive layer on one side of an optically transparent base material and then layer the two optically transparent conductive materials.

The optically transparent electrode 20 shown in FIG. 1 can be easily produced by providing an optically transparent conductive layer 2a on an optically transparent base material 1a by a known method; providing an optically transparent conductive layer 2b on an optically transparent base material 1b; and layering, via an adhesive layer 4, the optically transparent conductive layer 2b supported on the optically transparent base material 1b on the other side (the side not having the optically transparent conductive layer 2a) of the optically transparent base material 1a. The optically transparent electrode shown in FIG. 1 is further provided with a protective base material 3 on the optically transparent conductive layer 2a via an adhesive layer 4, and therefore when the optically transparent electrode is used as a touchscreen, an operator will look at the optically transparent electrode 20 from above the protective base material 3. The optically transparent base material 1b also serves as a protective base material for the other side of the optically transparent electrode 20.

Figure 2:
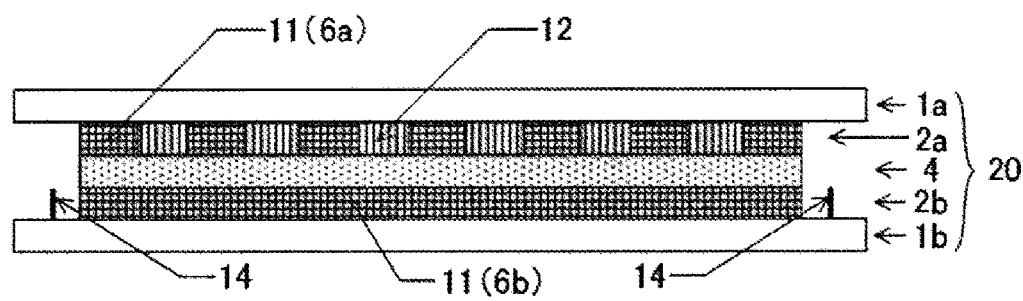
FIG. 2 is a schematic view showing a cross-section of another example of the optically transparent electrode of the present invention.

FIG. 2 is a schematic view showing a cross-section of another example of the optically transparent electrode of the present invention. The optically transparent electrode 20 shown in FIG. 2 can be easily produced by providing an optically transparent conductive layer 2a on an optically transparent base material 1a (on the lower side in the drawing) by a known method; providing an optically transparent conductive layer 2b on an optically transparent base material 1b; and layering, via an adhesive layer 4, the optically transparent conductive layer 2a and the optically transparent conductive layer 2b. In this case, the optically transparent base materials 1a and 1b serve also as a protective base material for the optically transparent electrode 20. When the optically transparent electrode shown in FIG. 2 is used as a touchscreen, an operator will look at the optically transparent electrode 20 from above the optically transparent base material 1a.

Figure 3:
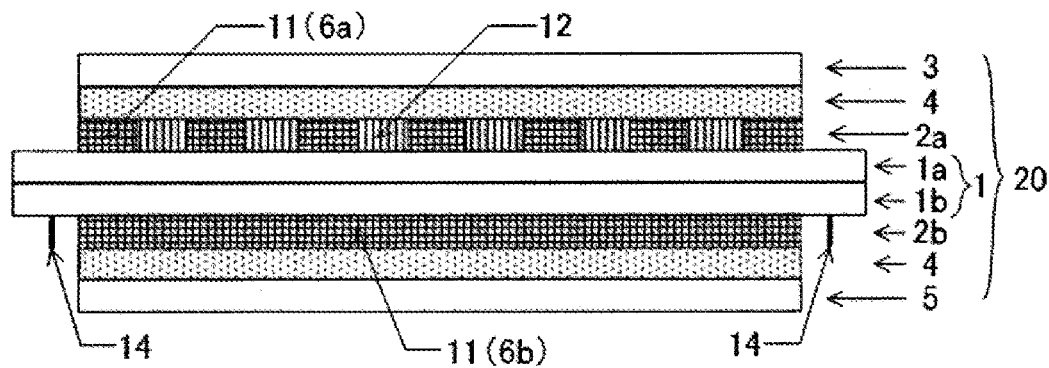
FIG. 3 is a schematic view showing a cross-section of another example of the optically transparent electrode of the present invention.

FIG. 3 is a schematic view showing a cross-section of another example of the optically transparent electrode of the present invention. In FIG. 3, an optically transparent conductive layer 2a is formed on an optically transparent base material 1a, and an optically transparent conductive layer 2b is formed on an optically transparent base material 1b (on the lower side in the drawing). The optically transparent conductive layers 2a and 2b are layered, via an adhesive layer 4, with a protective base material 3 and a protective base material 5, respectively. Such an optically transparent electrode can be easily produced, for example, by providing an optically transparent conductive layer 2a on an optically transparent base material 1a by a known method; providing an optically transparent conductive layer 2b on an optically transparent base material 1b; and joining the optically transparent base material 1a and the optically transparent base material 1b by thermal fusion bonding or via an adhesive layer not shown. When the optically transparent electrode shown in FIG. 3 is used as a touchscreen, an operator will look at the optically transparent electrode 20 from above the protective base material 3.

Also, in the present invention, it is possible to combine optically transparent conductive materials by a production method other than the above-mentioned methods, and to use, as an additional layer, a publicly known optical film, such as a hard coat film, an antireflection film, and an electromagnetic shielding film.

It is preferred to use, as protective base materials 3 and 5 shown in FIG. 1 and FIG. 3, a publicly known optically transparent sheet made of glass, polyesters, such as polyethylene terephthalate (PET) and polyethylene naphthalate (PEN), an acrylate resin, an epoxy resin, a fluoro resin, a silicone resin, a polycarbonate, a diacetate resin, a triacetate resin, a polyarylate, a polyvinyl chloride, a polysulfone, a polyether sulfone, a polyimide, a polyamide, a polyolefine, a cyclic polyolefin, etc. Here, "optically transparent" means that the total light transmittance is 60% or higher. The thicknesses of the protective base materials 3 and 5 are preferably 50 μm to 5 mm. Also, the protective base materials 3 and 5 may be provided with a publicly known layer, such as an antifingerprint layer, a hard coat layer, an antireflection layer, and an antiglare layer. The materials of the protective base material 3 and the protective base material 5 in FIG. 3 may be the same or different.

In FIG. 2 described above, the optically transparent base materials 1a and 1b lie as outermost surfaces, and in this case, the optically transparent base materials 1a and 1b are required to have the same function as that of a protective base material. In cases where the optically transparent base material itself does not have the function, the optically transparent base material is preferably laminated, via an adhesive layer or the like, with the protective base material described above. As the optically transparent base materials 1a and 1b in FIGS. 1 to 3, a publicly known base material having a total light transmittance of 60% or higher may be used. Examples of such a known base material include a sheet similar to the protective base materials 3 and 5 described above. The thicknesses of the optically transparent base materials 1a and 1b are preferably 50 to 300 μm.

As the adhesive layer 4 which the optically transparent electrode 20 shown in FIGS. 1 to 3 has, publicly known resin compositions that are optically transparent after adhesion can be used, and examples thereof include adhesives, such as acrylic adhesives and urethane adhesives; thermoplastic resins, such as ethylene-vinylacetate copolymer (EVA), polyvinyl butyral (PVB), and urethane hot-melt adhesives; thermosetting resins, such as epoxy resins and thermosetting urethane resins; ultraviolet curable resins, such as acrylic ultraviolet curable resins and epoxy ultraviolet curable resins; etc. It is well known in the industry that the optically transparent conductive layers 2a and 2b need to be insulated. For example, in FIG. 1, the optically transparent conductive layer 2a and 2b are insulated by the optically transparent base material 1a and the adhesive layer 4; in FIG. 2, the optically transparent conductive layers 2a and 2b are insulated by the adhesive layer 4; and in FIG. 3, the optically transparent conductive layers 2a and 2b are insulated by the optically transparent base materials 1a and 1b.

In the present invention, the positional relationship between the two optically transparent conductive layers is particularly important, and as long as the positional relationship between the optically transparent conductive layers 2a and 2b satisfies the requirements described below, similar effects can be obtained with the configuration shown in FIG. 1, 2, or 3 or even with another configuration. For convenience, the optically transparent electrode of FIG. 1 is used as an example in the following explanation.

FIG. 4 is a schematic plan view showing a part of the configuration of the optically transparent electrode of the present invention, where an optically transparent conductive material 1a having an optically transparent conductive layer 2a and an optically transparent conductive material 1b having an optically transparent conductive layer 2b in FIG. 1 are shown, and the protective base material 3 and the adhesive layer 4 are omitted for convenience of explanation. The optically transparent conductive layers 2a and 2b each consist of a sensor part 11 (a sensor part composed of a plurality of column electrodes 6, each of which is electrically connected via a wiring part 14 to a terminal part 15) that senses the changes in capacitance and has optical transparency and a dummy part 12 (a dummy part composed of a metal pattern 16 not electrically connected to the terminal part 15) that also has optical transparency. The optically transparent conductive materials 1a and 1b each have a non-image part 13, which does not have these metal pattern sites.

In the present invention, the sensor part 11 may be electrically connected by direct contact with the terminal part 15, but is preferably electrically connected with the terminal part 15 via the wiring part 14 as shown in FIG. 4 for assemblage of multiple terminal parts 15.

The column electrode 6a composing the sensor part 11 in the optically transparent conductive layer 2a is connected, via a wiring part 14, to a terminal part 15. By connecting the terminal part 15 to the outside, the changes in capacitance detected by the sensor part 11 can be captured. Meanwhile, metal patterns not electrically connected to the terminal part 15 all serve as dummy parts in the present invention. In the present invention, the wiring part 14 and the terminal part 15 need not particularly have optical transparency, and therefore may either be a solid pattern without spaces or be optically transparent as the column electrodes 6a are.

In the optically transparent conductive layer 2a in FIG. 4, column electrodes 6a and dummy parts 12 extending in the x direction are arranged as a plurality of columns alternating with each other, and the average center-to-center distance of the column electrodes 6a is M. Meanwhile, in the optically transparent conductive layer 2b, column electrodes 6b and dummy parts 12 extending in the y direction perpendicular to the x direction are arranged as a plurality of columns alternating with each other, and the average center-to-center distance of the column electrodes 6b is L.

Figure 5:
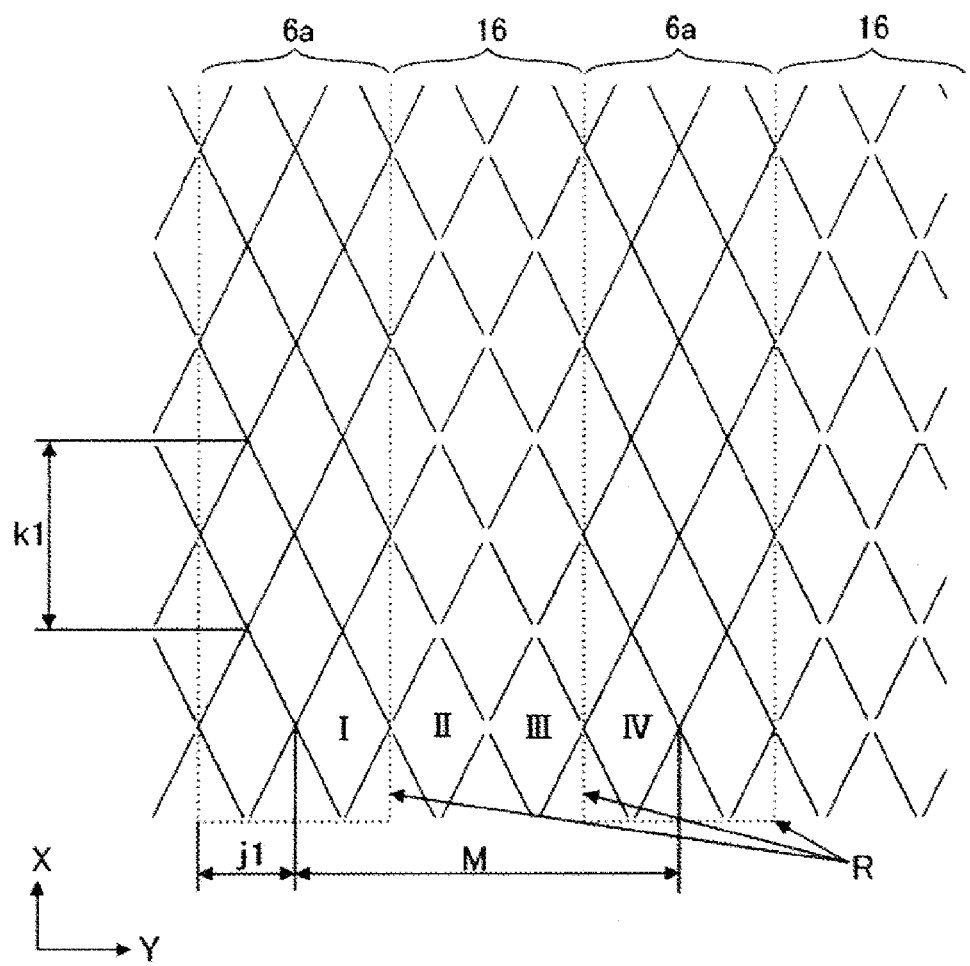
FIG. 5 is an enlarged plan view showing a part of the optically transparent conductive layer 2a in FIG. 4.

FIG. 5 is an enlarged plan view showing a part of the optically transparent conductive layer 2a in FIG. 4. In FIG. 5, column electrodes 6a and metal patterns 16 constituting dummy parts extending in the x direction are arranged as a plurality of columns alternating with each other, and the column electrodes 6a each have a repetition unit metal pattern, which is a lozenge. Meanwhile, since the metal patterns 16 constituting dummy parts (the parts separated from column electrodes 6a by imaginary boundary lines R shown as dashed lines for the purpose of illustration) are provided with line breaks near the vertices of each lozenge, there is no electrical conduction between the metal patterns 16 and column electrodes 6a. However, if the line breaks are filled by extending each side, the constituent (unit shape) of the metal pattern 16 will be a lozenge congruent with the lozenge unit metal pattern of the column electrode 6. In FIG. 5, the average length (average repetition pitch) of the lozenge unit metal pattern of the column electrode 6a in the x direction is k1, and the average length (average repetition pitch) in the y direction is j1. The values of k1 and j1 may be set as desired at the time of designing the pattern. In FIG. 5, k1 can be determined by dividing the length of the column electrode 6a (the length in the x direction) by the repetition number of the repetition unit in the x direction. Also, j1 can be determined by dividing the width of the column electrode 6a (the length in the y direction) by the repetition number of the repetition unit in the y direction, or by dividing the average center-to-center distance M by the repetition number of the repetition unit in the y direction, i.e., the number of the repetition units existing between the center lines of two column electrodes adjacent to each other, described later, (in FIG. 5, where congruent lozenges I to IV exist each as the repetition unit, the repetition number is 4).

In FIG. 5 and in FIG. 6 described later, the repetition unit of the column electrodes 6a and 6b is congruent with the repetition unit (including the shape where line breaks are filled by extending each side) of the metal patterns 16 constituting the dummy parts. In the present invention, congruence of the repetition units with each other is most preferred in terms of visibility (for reduced visibility), but complete congruence is not necessary and being almost the same is also preferred. In the present invention, "almost the same" means that the length of each side, the angle of the grid, the position of each side, and the width of each side are almost the same, and specifically means that the difference in the length of each side is within the range of ±10%, the difference in the angle of the grid is within the range of ±5°, the difference in the position of each side is within the range of ±10% of the length of each side, and the difference in the width (line width) of each side is within the range of ±50%, between the unit shapes.

The value of M as the average center-to-center distance of the column electrodes 6a may be set as desired at the time of designing the pattern, and may be confirmed as follows: a line passing the center of the width of a column electrode in the x direction is determined as the center line; regarding all the combinations of two column electrodes adjacent to each other, distances between the center lines are determined; and the arithmetic average thereof is calculated. In the calculation of the arithmetic average of the distances between the center lines, 10% of greater deviation may be excluded from the population.

In FIG. 5, the column electrodes 6a constituting the sensor part and the metal patterns 16 constituting the dummy parts are each formed of a repetition of a lozenge unit metal pattern. However, a repetition unit of any shape, such as those described in Patent Literature 1 mentioned above, may be used. Each side may be not a straight line but a zigzag line, a wavy line, etc. Also, the stripe pattern and brick pattern as disclosed in JP 2002-223095 A may also be used as the repetition unit. Preferably used is a basic shape which is suitable for forming a periodic structure having a short repetition pitch both in the x direction and in the y direction and which has the least number of sides having different angles relative to the x or y direction. Therefore, in the present invention, preferred basic shapes are a lozenge and a parallelogram, and more preferred is a lozenge. It is preferable that the diagonals of the lozenge are in the directions of x and y, and that an angle between adjacent two sides is 30 to 70°. The interval between the lines (distance between opposite sides) of the repetition unit is preferably 400 μm or less. The line width is preferably 20 μm or less, more preferably 1 to 15 μm or less, and further more preferably 1 to 10 μm.

As mentioned above, there must be no electrical conduction between the column electrodes 6a constituting the sensor part and the metal patterns 16 constituting the dummy parts. The method for breaking electrical conduction may by any method, and examples thereof include a method in which parts of the metal patterns 16 are provided with line breaks as shown in FIG. 5 and a method in which the repetition unit of the column electrodes 6b and the repetition unit of the metal patterns 16 are displaced along the boundary between the column electrode 6b and the metal pattern 16 (imaginary boundary lines R shown as dashed lines for the purpose of illustration) as shown in FIG. 6 described later. In cases where line breaks are provided, the line break width (interval between the two lines flanking the line break) is preferably 1 to 40 μm, more preferably 4 to 20 μm, and still more preferably 6 to 12 μm. The line break maybe provided at a place not on the boundary line R. As shown in FIG. 6, in the method in which the repetition unit of the column electrodes 6b and the repetition unit of the metal patterns 16 are displaced along the boundary between the column electrode 6b and the metal pattern 16, the displacement distance is preferably 1.5 times or more of the line width of the metal pattern and 50 μm or less, and more preferably twice or more of the line width and 40 μm or less. Further, in the present invention, the method in which the electrical conduction between the column electrodes 6a and the metal patterns 16 is broken as shown in FIG. 5 and the method in which the repetition unit of the column electrodes 6b and the repetition unit of the metal patterns 16 are displaced along the boundary to break the electrical conduction between the column electrodes 6b and the metal patterns 16 as shown in FIG. 6 may be used together in combination.

Figure 6:
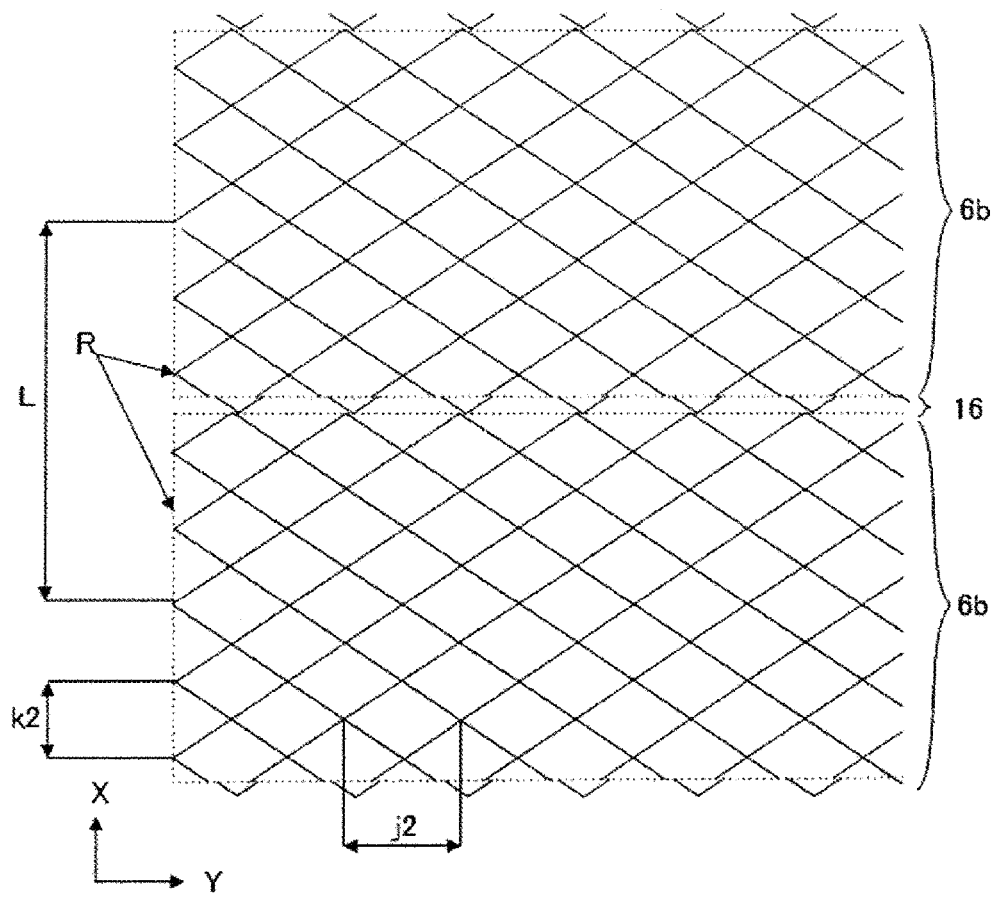
FIG. 6 is an enlarged plan view showing a part of the optically transparent conductive layer 2b in FIG. 4.

FIG. 6 is an enlarged plan view showing the optically transparent conductive layer 2b in FIG. 4. In FIG. 6, column electrodes 6b and metal patterns 16 constituting dummy parts extending in the y direction are arranged as a plurality of columns alternating with each other, and the column electrodes 6b each have a repetition unit metal pattern, which is a lozenge. The metal patterns 16 constituting dummy parts (the parts separated from column electrodes 6b by imaginary boundary lines R shown as dashed lines for the purpose of illustration) are formed of a part of a lozenge unit metal pattern displaced along the boundary line R relative to the lozenge unit metal pattern of the column electrodes 6b. Therefore, there is no electrical conduction between the metal patterns 16 and the column electrodes 6b. The metal patterns 16 are formed of a part of a lozenge unit metal pattern, and the part of a lozenge unit metal pattern, when slid for a predetermined length along the boundary line R, agrees with the lozenge unit metal pattern of the column electrodes 6b. In FIG. 6, the average length (average repetition pitch) of the repetition unit metal pattern (lozenge) of the column electrode 6b in the x direction is k2, the average length (average repetition pitch) in the y direction is j2, and the average center-to-center distance of column electrodes 6b is L. The methods for setting and confirming k2, j2, and L in FIG. 6 are the same as those for k1, j1 and M of the optically transparent conductive layer 2a in FIG. 5.

The optically transparent electrode of the present invention needs to satisfy all of the following requirements (a) to (c).

$$j1 < k1 \quad \text{(a)}$$

$$2M = n \times j1 \quad \text{(b)}$$

(n is a natural number)

$$k2 < j2; \quad \text{(c)}$$

and neither k1/j2 nor j2/k1 is a natural number.

Further, the following requirement (d) is preferably satisfied to achieve the object of the present invention.

$$2L = p \times k2 \quad \text{(d)}$$

(p is a natural number)

Also, the following requirement (e) is preferably satisfied to achieve the object of the present invention.

$$2L = q \times k1 \quad \text{(e)}$$

(q is a natural number)

When these requirements are satisfied, an optically transparent electrode which is more excellent in the stability of electrical resistance values can be obtained.

Regarding the relation between k1 and j1, the following requirement is preferably satisfied. Preferably 0.15× k1<j1<0.7×k1, and more preferably 0.35×k1<j1<0.6×k1. Also, regarding the relation between k2 and j2, the following requirement is preferably satisfied. Preferably 0.15× j2<k2<0.7×j2, and more preferably 0.35×j2<k2<0.6×j2. When these requirements are satisfied, an optically transparent electrode which is more excellent in the stability of electrical resistance values can be obtained.

The optically transparent electrode of the present invention may be provided with, in addition to the two optically transparent conductive layers described above, a publicly known layer, such as a hard coating layer, an antireflection layer, an adhesive layer, and an antiglare layer at any location. Also, between the optically transparent base material and the optically transparent conductive layer, a publicly known layer, such as a physical development nuclei layer, an easily adhering layer, and an adhesive layer may be provided.

EXAMPLES

Hereinafter, the present invention will be illustrated in more detail by Examples, but the present invention is not limited thereto unless it goes beyond the technical scope thereof.

Example 1

As an optically transparent base material, a 100-μm-thick polyethylene terephthalate film was used. The total light transmittance of this optically transparent base material was 91%.

Next, in accordance with the following formulation, a physical development nuclei coating liquid was prepared, applied onto one side of the optically transparent base material, and dried to provide a physical development nuclei layer.

<Preparatian of Palladium Sulfide Sol>

| Liquid A | Palladium chloride | 5 g |
|---|---|---|
| | Hydrochloric acid | 40 mL |
| | Distilled water | 1000 mL |
| Liquid B | Sodium sulfide | 8.6 g |
| | Distilled water | 1000 mL |

Liquid A and Liquid B were mixed with stirring for 30 minutes, and then passed through a column filled up with an ion exchange resin to give a palladium sulfide sol.

<Preparation of Physical Development Nuclei Coating Liquid>

| per m² of silver halide photosensitive material | |
|---|---|
| The above-prepared palladium sulfide sol | 0.4 mg |
| 2 mass % glyoxal aqueous solution | 0.2 mL |
| Surfactant (S-1) | 4 mg |
| Denacol EX-830 | 50 mg |
| (Polyethylene glycol diglycidyl ether made by Nagase Chemtex Corp.) | |
| 10 mass % SP-200 aqueous solution | 0.5 mg |
| (Polyethyleneimine made by Nippon Shokubai Co., Ltd.; average molecular weight: 10,000) | |

Subsequently, an intermediate layer, a silver halide emulsion layer, and a protective layer, of which the compositions are shown below, were applied in this order (from closest to the optically transparent base material) onto the above physical development nuclei liquid layer, and dried to give a silver halide photosensitive material. The silver halide emulsion was produced by a general double jet mixing method for photographic silver halide emulsions. The silver halide emulsion contained silver halide composed of 95 mol % of silver chloride and 5 mol % of silver bromide and had an average particle diameter of 0.15 μm. The obtained silver halide emulsion was subjected to gold and sulfur sensitization using sodium thiosulfate and chloroauric acid by the usual method. The silver halide emulsion obtained in this way contained 0.5 g of gelatin per gram of silver.

<Composition of Intermediate Layer/Per m² of Silver Halide Photosensitive Material>

| Gelatin | 0.5 g |
|---|---|
| Surfactant (S-1) | 5 mg |
| Dye 1 | 50 mg |

S-1

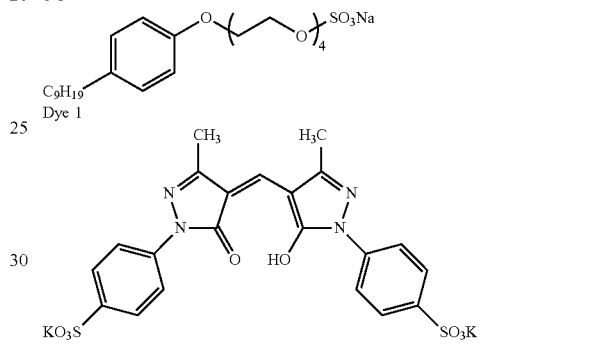

Dye 1

<Composition of Silver Halide Emulsion Layer/Per m² of Silver Halide Photosensitive Material>

| Gelatin | 0.5 g |
|---|---|
| Silver halide emulsion | Equivalent of 3.0 g of silver |
| 1-Phenyl-5-mercaptotetrazole | 3 mg |
| Surfactant (S-1) | 20 mg |

<Composition of Protective Layer/Per m² of Silver Halide Photosensitive Material>

| Gelatin | 1 g |
|---|---|
| Amorphous silica matting agent, (average particle diameter: 3.5 μm) | 10 mg |
| Surfactant (S-1) | 10 mg |

Figure 7:
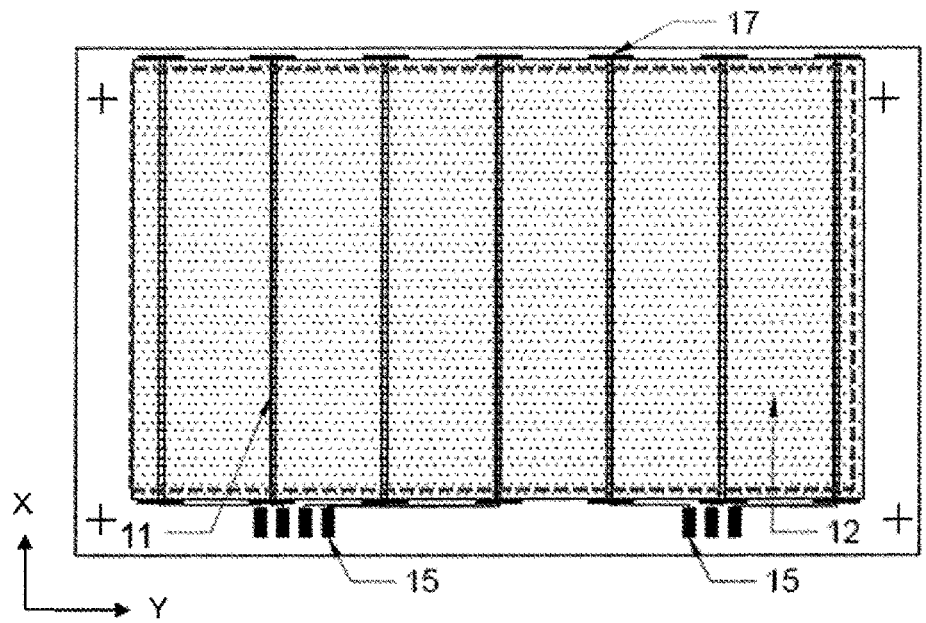
FIG. 7 is a plan view of the pattern manuscript used in Examples.
Figure 8:
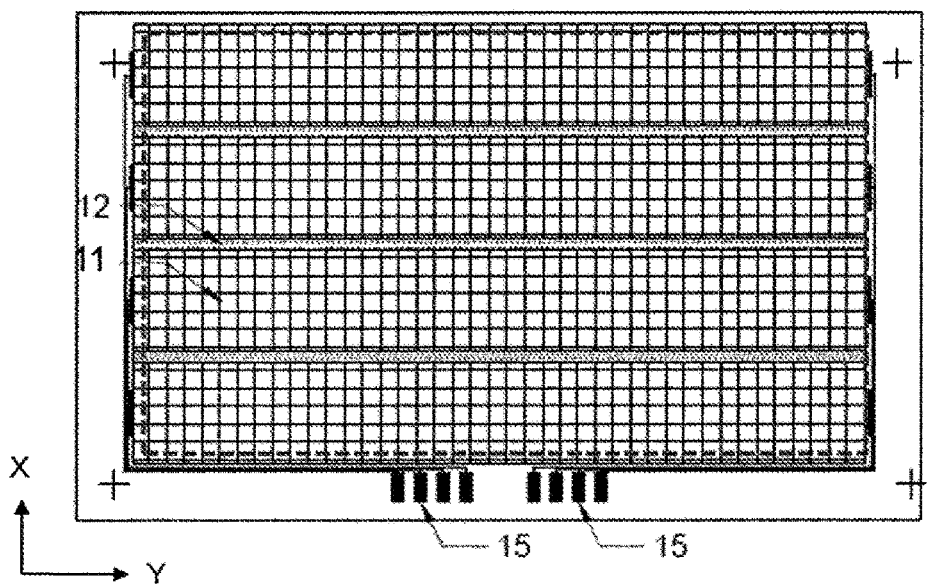
FIG. 8 is a plan view of the pattern manuscript used in Examples.

The silver halide photosensitive material obtained as above was brought into close contact with a transparent manuscript having the pattern shown in FIG. 7 or FIG. 8, and exposure was performed, through a resin filter which cuts off light of 400 nm or less, using a contact printer having a mercury lamp as a light source. In the patterns of FIG. 7 and FIG. 8, the sensor part 11 is latticed and the dummy part 12 is dotted for convenience. In the patterns of FIG. 7 and FIG. 8, the sensor part 11 and the dummy part 12 each have a structure in which a lozenge having a line width of 5 μm is repeated, and the directions of the two diagonals of the repeated lozenge agree with the direction in which column electrodes extend and the direction perpendicular thereto. By providing a line break of a width of 10 μm between the pattern constituting the column electrode and the pattern constituting the dummy part and a line break of a width of 7 μm at the midpoint of each side of the repetition unit as a lozenge of the dummy part, the electrical conduction between the column electrodes constituting the sensor part and the patterns constituting the dummy parts after the production of the metal pattern can be prevented. In FIG. 7, the average length of the repetition unit in the x direction (direction in which column electrodes extend) as k1 is 800 μm, the average length in the y direction (direction perpendicular to the x direction) as j1 is 375 μm, one of the angles formed by two adjacent sides of the lozenge (hereinafter designated as angle 1) is 50.2°, and the average center-to-center distance of column electrodes as M is 15 mm (see FIG. 5). In FIG. 8, the average length of the repetition unit in the x direction as k2 is 400 μm, the average length in the y direction as j2 is 750 μm, one of the angles formed by two adjacent sides of the lozenge (hereinafter designated as angle 2) is 56.1°, and the average center-to-center distance of column electrodes as L is 20 mm (see FIG. 6).

After the silver halide photosensitive material was immersed in the diffusion transfer developer shown below at 20° C. for 60 seconds, the silver halide emulsion layer, the intermediate layer, and the protective layer were washed off with warm water at 40° C., and a drying process was performed. In this way, optically transparent conductive materials each having a metal silver image having the pattern of FIG. 7 or FIG. 8 were separately obtained. The metal silver images of the optically transparent conductive layers of the obtained optically transparent conductive materials each have the exactly same shape and line width as those of the transparent manuscript having the pattern of FIG. 7 or FIG. 8. The film thickness of the metal silver image measured with a confocal microscope was 0.1 μm.

<Composition of Diffusion Transfer Developer>

| | |
|---|---|
| Potassium hydroxide | 25 g |
| Hydroquinone | 18 g |
| 1-Phenyl-3-pyrazolidone | 2 g |
| Potassium sulfite | 80 g |
| N-methylethanolamine | 15 g |
| Potassium bromide | 1.2 g |

Water was added to make the total volume of 1000 mL, and the pH was adjusted to 12.2.

The obtained two optically transparent conductive materials and a 2-mm thick polycarbonate board (made by Mitsubishi Gas Chemical Co., Inc., hereinafter abbreviated to PC board) were joined together with use of an optical adhesive tape (MHM-FW25 made by NICHIEIKAKOH CO., LTD. hereinafter abbreviated to OCA), so that the optically transparent conductive layer side of each of the two optically transparent conductive materials faces the PC board side, that alignment marks (+) at the four corners overlap, and that the OCA is used only in the rectangular area surrounded by the imaginary dashed line in FIG. 7 and FIG. 8 to produce an optically transparent electrode 1, where the PC board, the OCA, the optically transparent conductive material having a metal silver image having the pattern of FIG. 7, the OCA, and the optically transparent conductive material having a metal silver image having the pattern of FIG. 8 were joined together in this order.

Example 2, Example 3, Comparative Examples 1 to 5>

The same procedure was performed as in Example 1 except that transparent manuscripts in which the values of k1, j1, and angle 1 in FIGS. 7, and k2, j2, and angle 2 in FIG. 8 are those shown in Table 1 were used, and optically transparent electrodes of Example 2, Example 3, and Comparative Examples 1 to 5 were obtained. In all of the optically transparent electrodes, M was 15 mm and L was 20 mm.

The obtained optically transparent electrodes of Examples 1 to 3, and Comparative Examples 1 to 5 were evaluated for the occurrence of moire, the total light transmittance, and the stability of electrical resistance values by the method shown below. The results are shown in Table 1.

<Occurrence of Moire>

The obtained optically transparent electrode was placed on the screen of a 23" wide LCD monitor (RDT234WK (BK) made by Mitsubishi Electric) displaying solid white, and was evaluated based on the following criteria. Poor and Very Poor are not practically acceptable.

Fair: Moire was not confirmed by visual inspection.

Poor: Moire was confirmed by careful visual inspection.

Very Poor: Moire was clearly confirmed by visual inspection.

<Total Light Transmittance>

The obtained optically transparent electrode was measured for the total light transmittance of the portion in which the two optically transparent conductive materials and the PC board were joined with use of the OCA, with use of a haze meter (HZ-2 made by Suga Test Instruments Co., Ltd.).

<Stability of Electrical Resistance Values>

(1) For each column electrode of the optically transparent conductive material having the pattern of FIG. 7 of the obtained optically transparent electrode, the electric resistance value between the terminal part 15 electrically connected via the wiring part and the solid electrode 17 provided at the opposite end of the column electrode, which end was not connected to the wiring part, was measured.

(2) Next, for each column electrode of the optically transparent conductive material having the pattern of FIG. 8, the electric resistance value between a pair of terminal parts 15 electrically connected to the opposite sides of a column electrode via separate wiring parts was measured.

(3) Next, a voltage of 0.2 V was applied between all the terminal parts of the optically transparent conductive material having the pattern of FIG. 7 and all the terminal parts of the optically transparent conductive material having the pattern of FIG. 8 for 5 minutes.

(4) Next, the optically transparent electrode was left to stand in an environment at 60° C. and 90% RH for 120 hours.

(5) Next, the electric resistance values were measured by the same method as in (1) and (2) .

(6) Next, the column electrodes of the optically transparent electrode were observed with a magnifying lens to determine the presence or absence of line breaks.

(7) Next, for each column electrode of the optically transparent conductive material having the pattern of FIG. 7, the electric resistance value measured in (1) was compared with the electric resistance value measured in (5), and the proportion of the change to the electric resistance value measured in (1) was calculated. The minimum value and the maximum value were excluded, and the remaining values (of 5 column electrodes) were averaged for use as an index of the stability of electrical resistance values in the optically transparent conductive material having the pattern of FIG. 7. Also, for each column electrode of the optically transparent conductive material having the pattern of FIG. 8, the electric resistance value measured in (2) was compared with the electric resistance value measured in (5), and the proportion of the change to the electric resistance value measured in (2) was calculated. The values of all (four) of the column electrodes were averaged for use as an index of the stability of electrical resistance values in the optically transparent conductive material having the pattern of FIG. 8. In the comparison between the index of the stability of electrical resistance values in the optically transparent conductive material having the pattern of FIG. 7 and the index of the stability of electrical resistance values in the optically transparent conductive material having the pattern of FIG. 8, the larger was used as the index of the stability of electrical resistance values of the optically transparent electrode.

The above test results were evaluated based on the following criteria. 1 and 2 are not practically acceptable.

5: The index of the stability of electrical resistance values is less than 5%, and no column electrodes have line break.

4: The index of the stability of electrical resistance values is 5% or more and less than 10%, and no column electrodes have line break.

3: The index of the stability of electrical resistance values is 5% or more and less than 10%, and a part of column electrodes have line break.

2: The index of the stability of electrical resistance values is 10% or more, and a part of column electrodes have line break.

1: The index of the stability of electrical resistance values is significantly high, and all the column electrodes have line break.

TABLE 1

| Optically transparent electrode | k1 (μm) | j1 (μm) | Angle 1 (°) | k2 (μm) | j2 (μm) | Angle 2 (°) | Occurrence of moire | Total light transmittance (%) | Stability of electrical resistance values |
|---|---|---|---|---|---|---|---|---|---|
| Example 1 | 800 | 375 | 50.2 | 400 | 750 | 56.1 | Fair | 85.1 | 5 |
| Example 2 | 800 | 375 | 50.2 | 390 | 750 | 54.9 | Fair | 85.1 | 4 |
| Example 3 | 620 | 375 | 62.3 | 390 | 750 | 54.9 | Fair | 85.0 | 3 |
| Comparative Example 1 | 1000 | 500 | 53.1 | 500 | 1000 | 53.1 | Poor | 86.7 | 1 |
| Comparative Example 2 | 500 | 250 | 53.1 | 250 | 500 | 53.1 | Poor | 81.3 | 4 |
| Comparative Example 3 | 444.44 | 500 | 83.8 | 400 | 750 | 56.1 | Very Poor | 85.1 | 2 |
| Comparative Example 4 | 800 | 375 | 50.2 | 500 | 468.75 | 86.3 | Very Poor | 85.0 | 2 |
| Comparative Example 5 | 800 | 370 | 49.6 | 400 | 750 | 56.1 | Fair | 85.1 | 2 |

The results in Table 1 show that the present invention provides an optically transparent electrode which has a high total light transmittance, hardly produces moire, and has an excellent stability of electrical resistance values and therefore is suitable as an optically transparent electrode for capacitive touchscreens.

REFERENCE SIGNS LIST 1a, 1b Optically transparent base material
2a, 2b Optically transparent conductive layer
3, 5 Protective base material
4 Adhesive layer
6a, 6b Column electrode
11 Sensor part
12 Dummy part
13 Non-image part
14 Wiring part
15 Terminal part
16 Metal pattern of dummy part
17 Solid electrode at the end of column electrode
20 Optically transparent electrode
R Imaginary boundary line
k1, k2 Average length of repetition unit in the first direction
j1, j2 Average length of repetition unit in the second direction
M Average center-to-center distance of column electrodes extending in the first direction
L Average center-to-center distance of column electrodes extending in the second direction

The invention claimed is:

1. An optically transparent electrode having, on an optically transparent base material, at least two optically transparent conductive layers having a sensor part electrically connected to a terminal part and a dummy part not electrically connected to the terminal part, the sensor part and the dummy part each having a repetition unit metal pattern of a predetermined shape, the sensor part of one of the optically transparent conductive layers being formed of a plurality of column electrodes extending in a first direction, the column electrodes and the dummy parts being arranged in an alternating manner, the sensor part of the other optically transparent conductive layer being formed of a plurality of column electrodes which extend in a second direction perpendicular to the first direction and are arranged alternately with the dummy parts, the optically transparent electrode satisfying all of the following requirements (a) to (c):

$$k1 > j1 \quad (a)$$

(wherein k1 denotes the average length in the first direction of the predetermined unit metal pattern of the column electrodes extending in the first direction of one of the optically transparent conductive layers, and j1 denotes the average length in the second direction of the same predetermined unit metal pattern);

$$2M = n \times j1 \quad (b)$$

(wherein M denotes the average center-to-center distance of the column electrodes extending in the first direction, and n denotes a natural number); and $$k2 < j2; \quad (c)$$

and neither k1/j2 nor j2/k1 is a natural number (wherein k2 denotes the average length in the first direction of the predetermined unit metal pattern of the column electrodes extending in the second direction of the other optically transparent conductive layer, and j2 denotes the average length in the second direction of the same predetermined unit metal pattern).

2. The optically transparent electrode of claim 1, satisfying the following requirement:

$$2L = p \times k2 \quad (d)$$

(wherein L denotes the average center-to-center distance of column electrodes of the other optically transparent conductive layer, the column electrodes extending in the second direction, and p denotes a natural number).

3. The optically transparent electrode of claim 1, satisfying the following requirement:

$$2L = q \times k1 \quad (e)$$

(wherein q denotes a natural number).

4. The optically transparent electrode of claim 1, satisfying the following requirement: $0.15 \times k1 \leq j1 < 0.7 \times k1$.

5. The optically transparent electrode of claim 4, satisfying the following requirement: $0.35 \times k1 \leq j1 < 0.6 \times k1$.

6. The optically transparent electrode of claim 1, satisfying the following requirement: $0.15 \times j2 < k2 < 0.7 \times j2$.

7. The optically transparent electrode of claim 6, satisfying the following requirement: $0.35 \times j2 < k2 < 0.6 \times j2$.

8. The optically transparent electrode of claim 1, wherein the predetermined unit metal pattern shape of the sensor part and the predetermined unit metal pattern shape of the dummy part are congruent.

9. The optically transparent electrode of claim 1, wherein the predetermined unit metal pattern shape is a lozenge, and the diagonals thereof are in the first direction and in the second direction.

10. The optically transparent electrode of claim 2, satisfying the following requirement:

$$2L = q \times k1 \quad (e)$$

(wherein q denotes a natural number).

11. The optically transparent electrode of claim 2, satisfying the following requirement: $0.15 \times k1 \leq j1 < 0.7 \times k1$.

12. The optically transparent electrode of claim 3, satisfying the following requirement: $0.15 \times k1 \leq j1 < 0.7 \times k1$.

13. The optically transparent electrode of claim 10, satisfying the following requirement: $0.15 \times k1 \leq j1 < 0.7 \times k1$.

14. The optically transparent electrode of claim 1, satisfying the following requirement: $0.35 \times k1 \leq j1 < 0.6 \times k1$.

15. The optically transparent electrode of claim 2, satisfying the following requirement: $0.35 \times k1 \leq j1 < 0.6 \times k1$.

16. The optically transparent electrode of claim 3, satisfying the following requirement: $0.35 \times k1 \leq j1 < 0.6 \times k1$.

17. The optically transparent electrode of claim 10, satisfying the following requirement: $0.35 \times k1 \leq j1 < 0.6 \times k1$.

18. The optically transparent electrode of claim 11, satisfying the following requirement: $0.35 \times k1 \leq j1 < 0.6 \times k1$.

19. The optically transparent electrode of claim 12, satisfying the following requirement: $0.35 \times k1 \leq j1 < 0.6 \times k1$.

20. The optically transparent electrode of claim 13, satisfying the following requirement: $0.35 \times k1 \leq j1 < 0.6 \times k1$.

* * * * *